US006643137B1

(12) United States Patent
Chung et al.

(10) Patent No.: US 6,643,137 B1
(45) Date of Patent: Nov. 4, 2003

(54) HEAT-DISSIPATING DEVICE WITH GROUNDING CAPABILITY

(75) Inventors: Yi-Chen Chung, Taipei (TW);
Hsuan-Cheng Wang, Taipei (TW);
I-Sung Huang, Taipei (TW)

(73) Assignee: Compal Electronics, Inc., Taipei (TW)

( * ) Notice: Subject to any disclaimer, the term of this patent is extended or adjusted under 35 U.S.C. 154(b) by 0 days.

(21) Appl. No.: 10/318,144

(22) Filed: Dec. 13, 2002

(51) Int. Cl.[7] ................................................ H05K 7/20
(52) U.S. Cl. ........................ 361/719; 361/704; 361/707; 361/709; 361/818; 257/706; 257/718; 257/719; 257/727; 174/16.3; 165/80.3; 165/185
(58) Field of Search ................................. 361/704, 709, 361/710, 707, 719–721, 818; 257/706, 707, 718, 722; 174/16.3; 165/80.3, 185

(56) References Cited

U.S. PATENT DOCUMENTS

| | | | | |
|---|---|---|---|---|
| 6,071,128 A | * | 6/2000 | Brewington et al. | 439/73 |
| 6,075,700 A | * | 6/2000 | Houghton et al. | 361/704 |
| 6,205,026 B1 | * | 3/2001 | Wong et al. | 361/704 |
| 6,226,185 B1 | * | 5/2001 | Lin | 361/704 |
| 6,296,520 B1 | * | 10/2001 | Horng | 439/607 |
| 6,362,977 B1 | * | 3/2002 | Tucker et al. | 361/818 |
| 6,377,474 B1 | * | 4/2002 | Archambeault et al. | 361/818 |
| 6,442,045 B1 | * | 8/2002 | Goodwin et al. | 361/816 |
| 6,473,305 B1 | * | 10/2002 | Gordon et al. | 361/704 |

* cited by examiner

Primary Examiner—Boris L. Chervinsky
(74) Attorney, Agent, or Firm—Bacon & Thomas PLLC

(57) ABSTRACT

A heat-dissipating device is adapted for use with a multi-layer circuit board having a grounding layer and that has an electronic component mounted thereon. The heat-dissipating device includes a heat-dissipating member, a grounding member and a connecting member. The heat-dissipating member is adapted to be disposed on a heat-radiating side of the electronic component. The grounding member includes a grounding tail and a grounding body connected to the grounding tail. The grounding tail is adapted to pass through the circuit board to connect electrically with the grounding layer and to dispose the grounding body between the heat-dissipating member and the circuit board. The connecting member interconnects the heat-dissipating member and the grounding member, and is adapted to be secured on the circuit board. The connecting member cooperates with the grounding member to make electrical connection between the heat-dissipating member and the grounding layer of the circuit board.

7 Claims, 4 Drawing Sheets

HEAT-DISSIPATING DEVICE WITH GROUNDING CAPABILITY

BACKGROUND OF THE INVENTION

1. Field of the Invention

The invention relates to a heat-dissipating device, more particularly to a heat-dissipating device with a grounding capability.

2. Description of the Related Art

With the increase in the computing speeds of central processing units (CPU) and other computing semiconductor chips, the heat generated thereby is also on the rise. In order to prevent undesired heat accumulation, which can result in chip malfunction or damage, heat-dissipating devices are widely used to achieve a heat-dissipating effect. Since the heat-dissipating devices usually include a heat-conductive and electrically conductive metal member that abuts against a heat-radiating side of semiconductor chips, when the metal member is grounded, an electromagnetic interference (EMI) shielding effect can be achieved at the same time.

Referring to FIG. 1, a conventional heat-dissipating device 1 is shown to be adapted to be mounted on a circuit board 2. The circuit board 2 includes a main body 21 with an intermediate grounding layer 22, and a socket connector 23 mounted on a top surface of the main body 21 for mounting an electronic component 3, such as an integrated circuit chip, on the main body 21. The heat-dissipating device 1 includes a heat-dissipating member 11 formed with a plurality of heat-dissipating fins 111, and a plurality of resilient members 12 connected to the main body 21 and surrounding the socket connector 23. As shown in FIG. 2, the resilient members 12 are made of a bent metal material, such as copper, and are generally C-shaped. The resilient members 12 are connected electrically, such as by soldering, to grounding points 24 of the circuit board 2 using known surface mounting techniques (SMT). The grounding points 24 are connected electrically to the grounding layer 22 (see FIG. 1). Referring again to FIG. 1, the heat-dissipating member 11 is further formed with a plurality of contact portions 112 corresponding to the resilient members 12, respectively. When the heat-dissipating member 11 is secured to the socket connector 23 by means of screw fasteners 13, the contact portions 112 abut against the resilient members 12, respectively, thereby connecting electrically the heat-dissipating member 11 to the grounding layer 22 to achieve a grounding effect.

However, the resilient members 12 are highly susceptible to elastic deformation after a period of use due to the C-shaped configuration thereof. Moreover, inappropriate positioning or excessive exerted forces when mounting the heat-dissipating member 11 will tend to deform the contact portions 112. In both situations, poor electrical contact between the resilient members 12 and the heat-dissipating member 11 arises, thereby resulting in inferior electromagnetic interference shielding. Furthermore, since grounding of the heat-dissipating member 11 is achieved through the resilient members 12, vibrations generated during delivery or use may result in detaching of the resilient members 12 either temporarily or permanently from the circuit board 2, which can disable the electromagnetic interference shielding effect.

In addition, aside from providing a grounding effect, the resilient members 12 also provide supporting and buffering functions for the contact portions 112. As such, the resilient members 12 must be distributed around the socket connector 23. In practice, not only will there be a need to allocate a lot of space for the resilient members 12, the circuit layout on the circuit board 2 must also take into consideration both the positions of the resilient members 12 and the configuration of the heat-dissipating member 11. Increased complexity in design and difficulty in space allocation are thus encountered.

SUMMARY OF THE INVENTION

Therefore, the object of the present invention is to provide a heat-dissipating device with a grounding capability and capable of effectively shielding electromagnetic interference.

Accordingly, the heat-dissipating device of this invention is adapted for use with a multi-layer circuit board having a grounding layer and that has an electronic component mounted thereon. The heat-dissipating device comprises:

a heat-dissipating member made of a heat-conductive and electrically conductive material and adapted to be disposed on a heat-radiating side of the electronic component;

a grounding member made of an electrically conductive material, the grounding member including a grounding tail and a grounding body connected to the grounding tail, the grounding tail being adapted to pass through the circuit board to connect electrically with the grounding layer and to dispose the grounding body between the heat-dissipating member and the circuit board; and a connecting member made of an electrically conductive material, interconnecting the heat-dissipating member and the grounding member, and adapted to be secured on the circuit board, thereby retaining the heat-dissipating member on the circuit board, the connecting member cooperating with the grounding member to make electrical connection between the heat-dissipating member and the grounding layer of the circuit board.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

Figure 1:
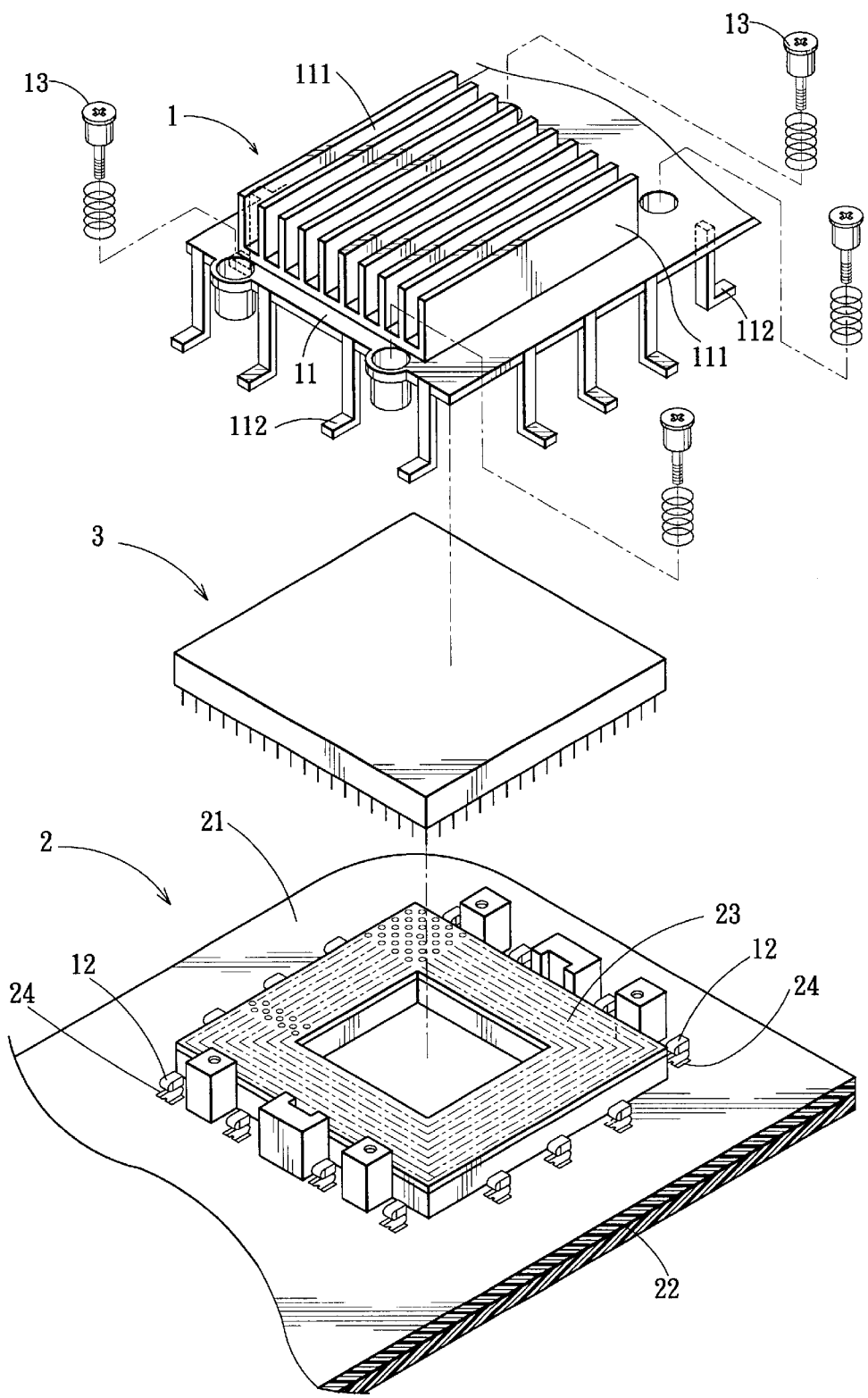
FIG. 1 is an exploded perspective view showing a conventional heat-dissipating device.
Figure 2:
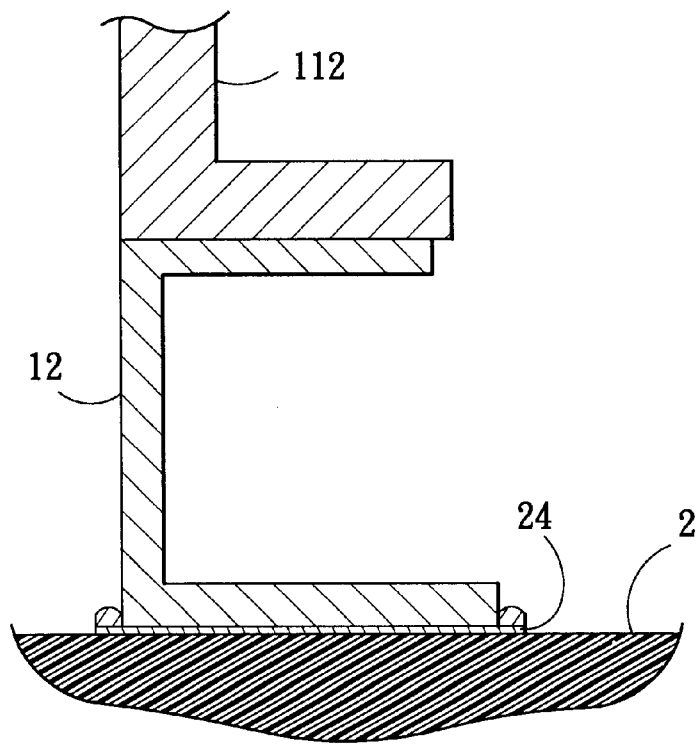
FIG. 2 is a fragmentary schematic sectional view showing a resilient member of the conventional heat-dissipating device of FIG. 1.
Figure 3:
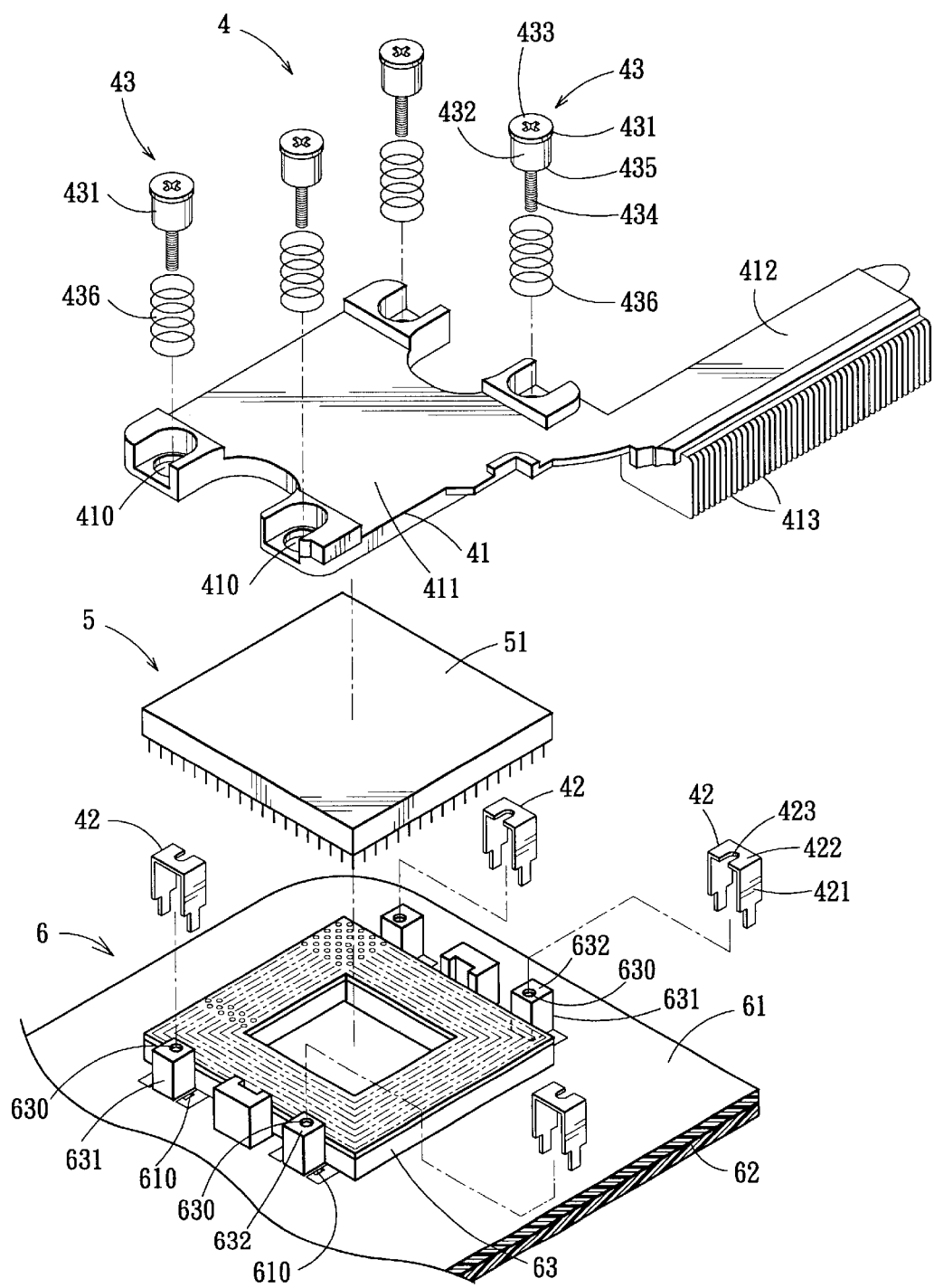
FIG. 3 is an exploded perspective view showing the preferred embodiment of a heat-dissipating device with a grounding capability according to the present invention.
Figure 4:
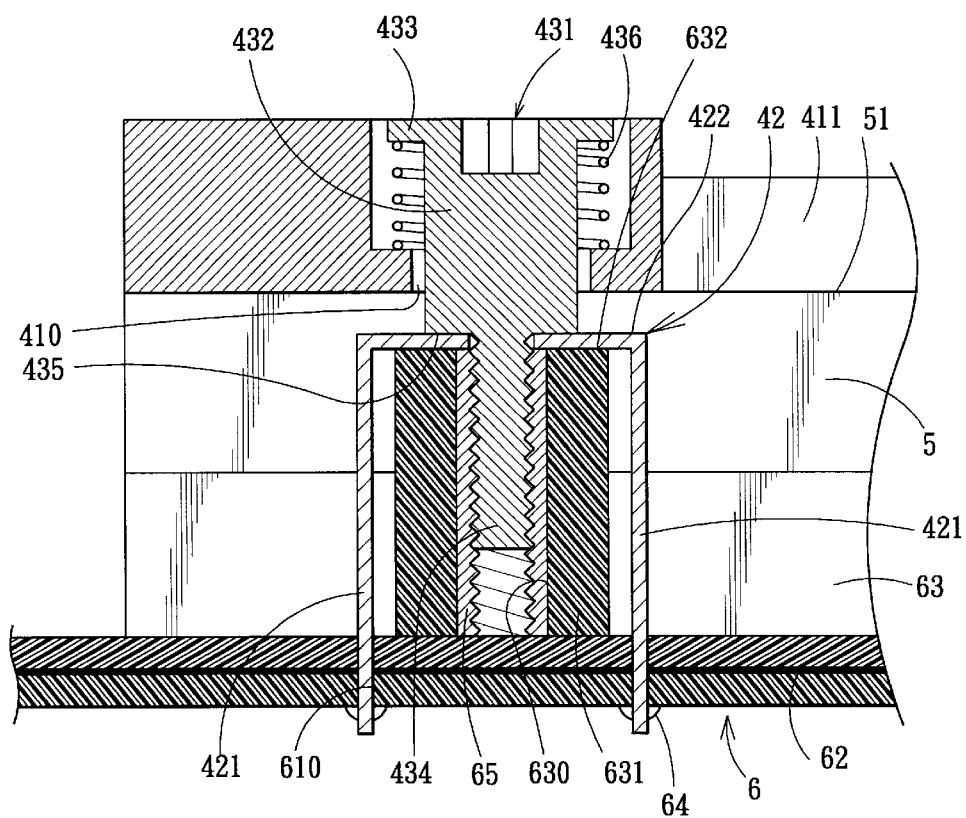
FIG. 4 is a fragmentary schematic sectional view of the preferred embodiment in a state of use.

Referring to FIGS. 3 and 4, the preferred embodiment of a heat-dissipating device 4 according to the present invention is shown to be adapted to be mounted on a multi-layer circuit board 6. The circuit board 6 includes a board body 61 with an intermediate grounding layer 62, and a socket connector 63 mounted on the top surface of the board body 61 for mounting an electronic component 5, such as a CPU, on the board body 61.

The heat-dissipating device 4 includes a heat-dissipating member 41 to be disposed on a heat-radiating side 51 of the electronic component 5, four grounding members 42 passing through the board body 61 of the circuit board 6 to connect electrically with the grounding layer 62, and four connecting members 43 interconnecting the heat-dissipating member 41 and a respective one of the grounding members 42.

The heat-dissipating member 41 is made of a heat-conductive and electrically conductive material, and has a contact part 411 adapted to be disposed on the heat-radiating side 51 of the electronic component 5, an extension part 412 extending horizontally from the contact part 411, and a plurality of heat-dissipating fins 413 formed on the extension part 412. The contact part 411 is formed with four through holes 410 in four corners thereof for passage of the connecting members 43 therethrough.

The socket connector 63 of the circuit board 6 is formed with four supporting posts 631 that are registered with the four through holes 410, respectively. Each of the supporting posts 631 is formed with a respective upright positioning hole 630 for connecting threadedly with a corresponding connecting member 43. An internally threaded metal nut 65 is fixed in each positioning hole 630. The board body 61 is further formed with four pairs of board holes 610. The board holes 610 in each pair are disposed on opposite lateral sides of a respective one of the supporting posts 631.

The grounding members 42 are made of an electrically conductive material, and are disposed to straddle the supporting posts 631, respectively. In this embodiment, each of the grounding members 42 includes a parallel pair of grounding tails 421 and a grounding body 422 that interconnects the pair of grounding tails 421. The grounding tails 421 are adapted to pass through the board holes 610 in the board body 61 to connect electrically with the grounding layer 62 and to dispose the grounding body 422 between the heat-dissipating member 41 and the board body 61. The grounding body 422 is formed as a plate that interconnects the grounding tails 421 at one end that is remote from the board body 61. When the grounding members 42 straddle the supporting posts 631, each grounding body 422 abuts closely against the top surface 632 of the corresponding supporting post 631, thereby supporting firmly the grounding members 42 on the circuit board 6. Solder material 64 is applied on a bottom surface of the board body 61 to secure the grounding tails 421 on the board body 61 and ensure electrical connection between the grounding members 42 and the grounding layer 62. The grounding body 422 of each grounding member 42 is further formed with a notch 423 that is registered with the positioning hole 630 in the corresponding supporting post 631.

Each connecting member 43 is made of an electrically conductive material, interconnects the heat-dissipating member 41 and the respective grounding member 42, and is adapted to be secured on the circuit board 6, thereby retaining the heat-dissipating member 41 on the circuit board 6. Each connecting member 43 includes a screw fastener 431 with a threaded shank portion 434 that extends through one of the through holes 410 in the heat-dissipating member 41 and the notch 423 in the respective grounding member 42, and that is adapted to engage threadedly the circuit board 6 through the internally threaded metal nut 65 in the positioning hole 630 of a respective one of the supporting posts 631. Each screw fastener 431 further includes a head portion 432 connected to the shank portion 434, and a radial outward stop flange 433 formed on one end of the head portion 432 that is remote from the shank portion 434. In this embodiment, the head portion 432 has a diameter larger than that of the shank portion 434 such that a shoulder 435 is formed at the junction of the head and shank portions 432, 434. As such, in a tightened state of the screw fastener 431, the shoulder 435 abuts closely against the grounding body 422 of the respective grounding member 42. At this time, the connecting member 43 cooperates with the grounding member 42 to make electrical connection between the heat-dissipating member 41 and the grounding layer 62. Each connecting member 43 further includes a conductive biasing member 436 provided on the head portion 432 of the screw fastener 431 and biasing the heat-dissipating member 41 toward the electronic component 5. In this embodiment, the conductive biasing member 436 is in the form of a conductive coil spring that is sleeved on the head portion 432 of the screw fastener 431. Since each conductive biasing member 436 has a diameter larger than that of the through holes 410 in the heat-dissipating member 41 but smaller than that of the stop flange 433 on the head portion 432 of the corresponding screw fastener 431, the opposite ends of the conductive biasing member 436 can abut against the stop flange 433 and the heat-dissipating member 41 at the rim of the corresponding through hole 410, respectively, so as to ensure that the contact part 411 of the heat-dissipating member 41 abuts tightly against the heat-radiating side 51 of the electronic component 5. At the same time, due to electrical contact between each screw fastener 431 and the contact part 411 of the heat-dissipating member 41 through the respective conductive biasing member 436, and between each screw fastener 431 and the respective grounding member 42, the heat-dissipating member 41 can be connected electrically to the grounding layer 62 to thereby achieve the desired grounding effect.

As described in the foregoing, the heat-dissipating device 4 with grounding capability of the present invention is mounted securely on the supporting posts 631 and is connected electrically to the grounding layer 62. Due to the buffering and conducting characteristics of the biasing members 436, and the securing and conducting functions of the screw fasteners 431, the heat-dissipating member 41 can be uniformly and resiliently positioned and stably and electrically connected to the grounding members 42. Therefore, the heat-dissipating device 4 with grounding capability of the present invention can serve the purpose of positioning as well as grounding while minimizing the adverse effects of elastic deformation and improper mounting that are commonly experienced in the prior art. The improved grounding and mounting effects also yield the result of maintaining good electromagnetic interference shielding. Moreover, since the grounding members 42 are fixed to the circuit board 6 and are also firmly positioned on the circuit board 6 together with the heat-dissipating member 41 through the connecting members 43, a vibration-proof structure is obtained so as to prevent the heat-dissipating member 41 and the grounding members 42 from breaking apart after assembly due to external forces. Furthermore, each grounding member 42 and the corresponding connecting member 43 are aligned in the same location so as to improve not only the space utilization of the circuit board 6, but also the flexibility in layout design of the circuit board 6 as compared with the prior art.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

We claim:

1. A heat-dissipating device for providing both heat dissipation and electromagnetic interference shielding to an electronic component that is mounted on a multi-layer circuit board, the circuit board having a grounding layer, said heat-dissipating device comprising:

a heat-dissipating member made of a heat-conductive and electrically conductive material and adapted to be disposed on a heat-radiating side of the electronic component;

a grounding member made of an electrically conductive material, said grounding member including a grounding tail and a grounding body connected to said grounding tail, said grounding tail being adapted to pass through the circuit board to connect electrically with the grounding layer and to dispose said grounding body between said heat-dissipating member and the circuit board; and a connecting member made of an electrically conductive material, interconnecting said heat-dissipating member and said grounding member, and adapted to be secured on the circuit board, thereby retaining said heat-dissipating member on the circuit board, said connecting member cooperating with said grounding member to make electrical connection between said heat-dissipating member and the grounding layer of the circuit board.

2. The heat-dissipating device as claimed in claim 1, wherein said grounding body is connected to one end of said grounding tail that is remote from the circuit board, said connecting member being in electrical contact with said grounding body.

3. The heat-dissipating device as claimed in claim 2, wherein said connecting member includes a screw fastener that extends through said heat-dissipating member and said grounding member and that is adapted to engage threadedly the circuit board.

4. The heat-dissipating device as claimed in claim 2, wherein said grounding member includes a parallel pair of said grounding tails, said grounding body being formed as a plate that interconnects said grounding tails at said one end that is remote from the circuit board.

5. The heat-dissipating device as claimed in claim 1, wherein said connecting member includes a screw fastener that extends through said heat-dissipating member and said grounding member and that is adapted to engage threadedly the circuit board.

6. The heat-dissipating device as claimed in claim 5, wherein said screw fastener includes a threaded shank portion and a head portion connected to said shank portion, said connecting member further including a conductive biasing member provided on said head portion and biasing said heat-dissipating member toward the electronic component.

7. The heat-dissipating device as claimed in claim 6, wherein said head portion is formed with a radial outward stop flange, said conductive biasing member including a conductive coil spring that is sleeved on said head portion and that has opposite ends abutting against said stop flange and said heat-dissipating member, respectively.

* * * * *